US006824813B1

(12) United States Patent
Lill et al.

(10) Patent No.: US 6,824,813 B1
(45) Date of Patent: Nov. 30, 2004

(54) SUBSTRATE MONITORING METHOD AND APPARATUS

(75) Inventors: Thorsten B. Lill, Sunnyvale, CA (US); Michael N. Grimbergen, Redwood City, CA (US); Jitske Trevor, Sunnyvale, CA (US); Wei-Nan Jiang, San Jose, CA (US); Jeffrey Chinn, Foster City, CA (US)

(73) Assignee: Applied Materials Inc, Santa Clara, CA (US)

( * ) Notice: Subject to any disclaimer, the term of this patent is extended or adjusted under 35 U.S.C. 154(b) by 0 days.

(21) Appl. No.: 09/545,110

(22) Filed: Apr. 6, 2000

(51) Int. Cl.[7] .......................... H05H 1/00; B05C 11/00; C23C 14/54
(52) U.S. Cl. ............................ 427/8; 427/10; 427/569; 216/60; 216/67; 118/665; 118/668; 118/677; 118/682; 118/688
(58) Field of Search ..................... 427/8, 10, 569, 427/488, 523, 9, 535, 562; 118/665, 668, 669, 677, 679, 682, 688, 691, 697, 712, 696, 723 R; 216/60, 85, 67, 87, 94; 204/192.13, 192.33, 298.03, 298.32; 356/319, 345, 352, 355, 372, 381, 388

(56) References Cited

U.S. PATENT DOCUMENTS

| 3,612,692 | A | | 10/1971 | Kruppa et al. ............... 356/108 |
|---|---|---|---|---|
| 3,985,447 | A | | 10/1976 | Aspnes ....................... 356/118 |
| 4,141,780 | A | | 2/1979 | Kleinknecht et al. ........ 156/626 |
| 4,147,435 | A | | 4/1979 | Habegger .................... 356/357 |
| 4,198,261 | A | | 4/1980 | Busta et al. ................. 156/626 |
| 4,317,698 | A | | 3/1982 | Christol et al. ............. 156/626 |
| 4,454,001 | A | * | 6/1984 | Sternheim et al. .......... 156/626 |
| 4,611,919 | A | | 9/1986 | Brooks, Jr. et al. ......... 356/357 |
| 4,680,084 | A | * | 7/1987 | Heimann et al. ............ 156/626 |
| 4,846,928 | A | * | 7/1989 | Dolins et al. ............... 156/626 |
| 4,847,792 | A | | 7/1989 | Barna et al. ................. 364/552 |
| 4,861,419 | A | | 8/1989 | Flinchbaugh et al. ....... 156/626 |
| 4,939,370 | A | * | 7/1990 | Meyer et al. ................. 427/10 |
| 5,131,752 | A | | 7/1992 | Yu et al. ...................... 356/369 |
| 5,151,295 | A | * | 9/1992 | Kawahara et al. ............ 427/12 |
| 5,288,367 | A | * | 2/1994 | Angell et al. ............... 156/626 |
| 5,362,356 | A | | 11/1994 | Schoenborn ................. 156/626 |
| 5,499,733 | A | | 3/1996 | Litvak ........................... 216/38 |
| 5,503,707 | A | | 4/1996 | Maung et al. ............. 156/626.1 |
| 5,564,830 | A | | 10/1996 | Böbel et al. ................. 374/126 |
| 6,081,334 | A | * | 6/2000 | Grimbergen et al. ........ 356/357 |
| 6,104,487 | A | * | 8/2000 | Buck et al. .................. 356/316 |
| 6,153,115 | A | * | 11/2000 | Le et al. ........................ 216/60 |
| 6,406,924 | B1 | * | 6/2002 | Grimbergen et al. ........... 438/9 |
| 6,574,525 | B1 | * | 6/2003 | Reder et al. .................. 427/10 |
| 6,686,130 | B2 | * | 2/2004 | Hayasaki et al. ............ 430/322 |
| 2003/0178390 | A1 | * | 9/2003 | Odor et al. .................... 216/84 |
| 2004/0026368 | A1 | * | 2/2004 | Barnes et al. .................. 216/60 |
| 2004/0084406 | A1 | * | 5/2004 | Kamp et al. ................... 216/59 |

FOREIGN PATENT DOCUMENTS

JP          404094533 A  *  3/1992  .................. 216/60

OTHER PUBLICATIONS

*Jamestowne Fine Silver polishidirections*, Jamestowne Wax. Co., Inc. Baltimore, MD, purchased between about 1990 & 1995.*
*Webster's 9th Collegiate Dictionary*, excerpt p.271 Merriam–Webster, Inc., USA, 1990 no month.*

* cited by examiner

Primary Examiner—Marianne Padgett
(74) Attorney, Agent, or Firm—Janah & Associates; Joseph Bach

(57) ABSTRACT

A substrate processing apparatus comprises a chamber 28 capable of processing a substrate 20. A radiation source 58 provides radiation that is at least partially reflected from the substrate in the chamber. A radiation detector 62 is provided to detect the reflected radiation and generate a signal. A controller 100 is adapted to receive the signal and determine a property of the substrate 20 in situ during processing, before an onset of during or after processing of a material on the substrate 20.

40 Claims, 8 Drawing Sheets

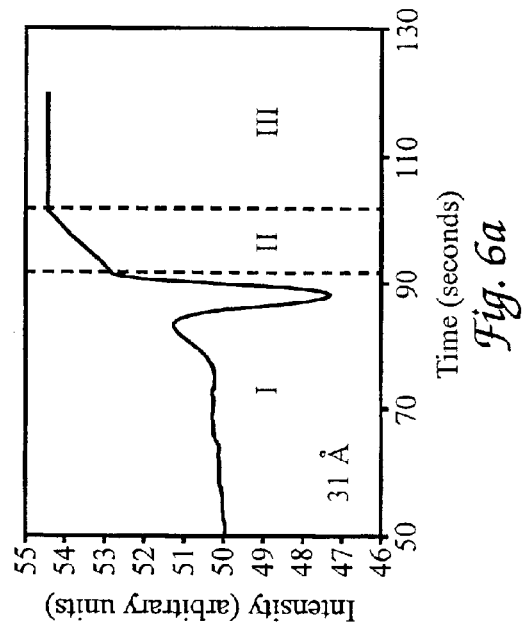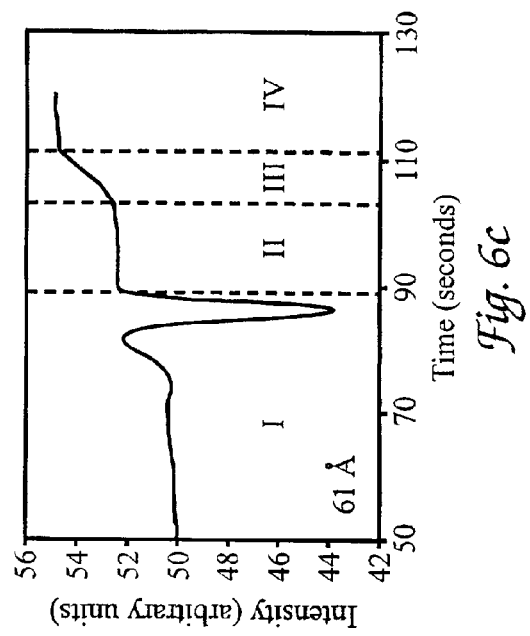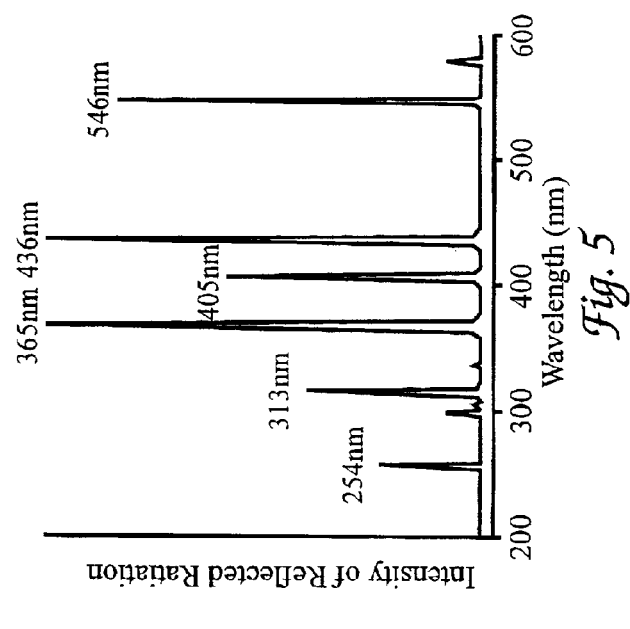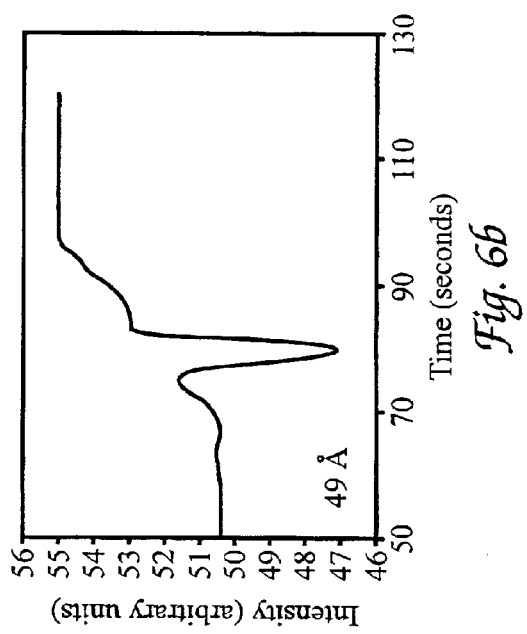

SUBSTRATE MONITORING METHOD AND APPARATUS

BACKGROUND

The invention relates to the monitoring of a process performed on a substrate and detection of a property of a material on the substrate.

In substrate fabrication processes, semiconductor, dielectric, and conductor materials, such as for example, polysilicon, silicon dioxide, aluminum and or tungsten silicide, are formed on a substrate by chemical vapor deposition (CVD), physical vapor deposition (PVD), and oxidation and nitridation processes; and the substrate may also be implanted with ions or etched in an etching process. In a typical CVD process, a reactive gas is used to deposit material on the substrate, and in a PVD process, a target is sputtered to deposit material on the substrate. In oxidation and nitridation processes, an oxide or nitride material, such as silicon dioxide or silicon nitride, respectively, is formed on the substrate by exposing the substrate to a suitable gaseous environment. In subsequent etching processes, a patterned etch resistant mask of photoresist or oxide hard mask is formed on the substrate by lithographic methods, and the exposed portions of the substrate are typically etched by an energized gas to form patterns of gates, vias, contact holes or interconnect lines.

In such processes, it is often desirable to use a process monitoring method to control processing of the substrate at predetermined stages or endpoint times. For example, in the etching of gate structures, it may be desirable to stop etching of overlying polysilicon as soon as the underlying dielectric is reached. However, the dielectric is often a thin layer which makes it difficult to etch through the overlying polysilicon without etching through the dielectric. As another example, it is desirable to stop etching when the dielectric is etched through or etched slightly beyond its thickness (a small depth into the underlying material) to ensure removal of all of the dielectric material. As a further example, it may be desirable to stop a deposition, oxidation or nitridation process when a predetermined thickness of material is obtained.

Typical process monitoring methods detect radiation in the chamber to monitor the process and determine a process endpoint. These methods include, for example, plasma emission analysis in which an emission spectrum of a plasma in the chamber is analyzed to determine a spectral change that arises from a change in the material being etched—which may occur upon etching through a material—as for example taught in U.S. Pat. No. 4,328,068 which is incorporated herein by reference. In another example, U.S. Pat. No. 5,362,256, which is also incorporated herein by reference, discloses a method of monitoring a process by monitoring a plasma emission intensity at a selected wavelength and correlating variations in the intensity with a process endpoint. In another method called ellipsometry, a polarized light beam reflected from a surface of a material being etched is analyzed to determine a phase shift and magnitude of the reflected beam, as for example disclosed in U.S. Pat. Nos. 3,874,797 and 3,824,017, both of which are incorporated herein by reference. In interferometry, a beam reflected from a material being processed is monitored to determine etch depth by counting maxima and minima in the reflectance signal or from cessation of the signal, as for example disclosed in U.S. Pat. No. 4,618,262 to Maydan et al, which is also incorporated herein by reference. While these process monitoring methods are useful to detect a process endpoint, they do not provide information on the stage of a process or a property of the material being processed.

It is desirable to have a process monitoring method capable of detecting a change in a property of a material being processed on a substrate. It is further desirable to have an apparatus capable of detecting etch through or a deposition endpoint of a layer being formed on the substrate. It is also desirable to have a process monitoring system capable of quantitatively measuring the property, such as the thickness of a material being processed on the substrate.

SUMMARY

The present invention is capable of satisfying these needs by allowing monitoring of a substrate fabrication process to detect a process stage or a property of a material on the substrate. In one aspect, the present invention comprises a substrate processing apparatus comprising a process chamber capable of processing a substrate. A radiation source is capable of providing non-polarized radiation that is at least partially reflected from a substrate in the chamber. A radiation detector is provided to detect the reflected radiation and generate a signal. A controller is adapted to receive the signal and determine a property of a material on the substrate in the chamber.

In one version, the apparatus comprises a computer having a memory capable of operating a computer-readable program embodied on a computer-readable medium, the computer readable program including program code to receive the signal and determine a property of the material on the substrate in the chamber.

In another aspect, the present invention relates to a method of processing a substrate, in which, the substrate is placed in a process zone, and process conditions are set in the process zone to process the substrate. Non-polarized radiation reflected from the substrate is detected before, after, or during processing of the substrate. The detected radiation is evaluated to determine a property of a material on the substrate in the chamber.

In another aspect, an apparatus comprises a process chamber capable of processing a substrate and a radiation source capable of providing radiation that is at least partially reflected from the substrate during processing. A radiation detector is provided to detect the reflected radiation and generate a signal. A controller is adapted to receive the signal and determine both an onset and a completion of processing of a material on the substrate.

In one version, the apparatus comprises a computer having a memory capable of operating a computer-readable program embodied on a computer-readable medium, the computer readable program including program code to receive a signal from the radiation detector and to detect both an onset and completion of processing of a material on the substrate.

In another aspect, a method of processing a substrate, in which, the substrate is placed in a process zone, and process conditions are set in the process zone to process the substrate. Radiation reflected from the substrate is detected, and both an onset and completion of processing of a material on the substrate may be determined.

In another aspect, an apparatus comprises a process chamber capable of processing a substrate in a plasma. One or more radiation detectors are provided to detect a radiation emission from the plasma and generate a first signal, and to detect a radiation reflected from the substrate and generate a second signal. A controller is adapted to receive the first and second signals.

In one version, the apparatus comprises a computer having a memory capable of operating a computer-readable program embodied on a computer-readable medium, the computer readable program including program code to receive the first and second signals and determine an event in the chamber or a property of a material on the substrate.

In another aspect, a method of processing a substrate, in which, the substrate is placed in the process zone, and process conditions are set to form a plasma to process the substrate. A radiation emission from the plasma is detected and a first signal is generated. A radiation reflected from the substrate is also detected and a second signal is generated. The first and second signals are evaluated to determine the occurrence of an event in the process zone or a property of a material on the substrate.

In another aspect the apparatus comprises a chamber capable of processing a substrate, a radiation source capable of providing radiation that is at least partially reflected from a substrate in the chamber, a radiation detector adapted to detect the reflected radiation and generate a signal, and a controller adapted to receive the signal and determine the thickness of, or the dopant level in, a material on the substrate.

In one version, the apparatus comprises a computer having a memory capable of operating a computer-readable program embodied on a computer-readable medium, the computer readable program including program code to receive the signal and determine the thickness of, or the dopant level in, a material on the substrate.

In another aspect, a method of processing a substrate in which the substrate is placed in a process zone, radiation reflected from the substrate before, during, or after processing of the substrate in the process zone is detected, and the detected radiation is evaluated to determine the thickness of, or the dopant level in, a material on the substrate.

In another aspect, the apparatus comprises a chamber capable of processing a substrate, a radiation source capable of providing radiation that is at least partially reflected from a substrate in the chamber, a radiation detector adapted to detect the reflected radiation and generate a signal, and a controller adapted to receive the signal and evaluate an amplitude change of the reflected radiation in relation to a calculated or stored range of amplitude changes for a batch of substrates.

In another aspect, a method comprising the steps of placing a substrate in the process zone, detecting radiation reflected from the substrate before, during, or after processing of the substrate in the process zone, and evaluating an amplitude change of the reflected radiation relative to a calculated or stored range of amplitude changes for a batch of substrates.

In another aspect, the apparatus comprises a chamber capable of processing a substrate, a radiation source capable of providing radiation that is at least partially reflected from a substrate in the chamber, a radiation detector adapted to detect the reflected radiation and generate a signal, and a computer having a memory capable of operating a computer-readable program embodied on a computer-readable medium, the computer readable program including program code to receive the signal and evaluate an amplitude change of the reflected radiation in relation to a range of amplitude changes for a batch of substrates.

In another version, the apparatus comprising a chamber capable of processing a substrate, a radiation source capable of providing radiation that is at least partially reflected from a substrate in the chamber, a radiation detector adapted to detect the reflected radiation and generate a signal, and a controller adapted to receive the signal and evaluate the signal to determine if a thickness of an insulator on the substrate is sufficiently large to reduce electrical breakdown through the insulator.

In another aspect, a method comprising the steps of placing the substrate in the process zone, detecting radiation reflected from the substrate before, during, or after processing of the substrate in the process zone, and evaluating the reflected radiation to determine if a thickness of an insulator on the substrate is sufficiently large to reduce a possibility of electrical breakdown through the insulator.

In another aspect, the apparatus comprises a chamber capable of processing a substrate, a radiation source capable of providing radiation that is at least partially reflected from a substrate in the chamber, a radiation detector adapted to detect the reflected radiation and generate a signal, and means for evaluating the signal to determine a thickness of an insulator on the substrate before completion of processing.

In another aspect, the apparatus comprises a chamber capable of processing a substrate, a radiation source capable of providing radiation that is at least partially reflected from a substrate in the chamber, a radiation detector adapted to detect the reflected radiation and generate a signal, a controller adapted to receive the signal and generate a set of data relating to a property of the substrate, and a factory automation host computer to receive the data.

DRAWINGS

These and other features, aspects, and advantages of the present invention will be better understood from the following drawings, description and appended claims, which illustrate examples of the invention. However, it is to be understood that each of the features can be used in the invention in general, not merely in the context of a particular drawing, and the invention includes any combination of these features.

FIG. 5 is a graph of maxima peaks of different wavelengths of radiation emitted from a mercury discharge lamp and at least partially reflected by the substrate;

FIGS. 6a through 6e are graphs of the amplitude of reflected radiation obtained during etching of polysilicon material overlying dielectric, showing the onset, transition, and completion of etching of underlying dielectric;

Figure 8B:
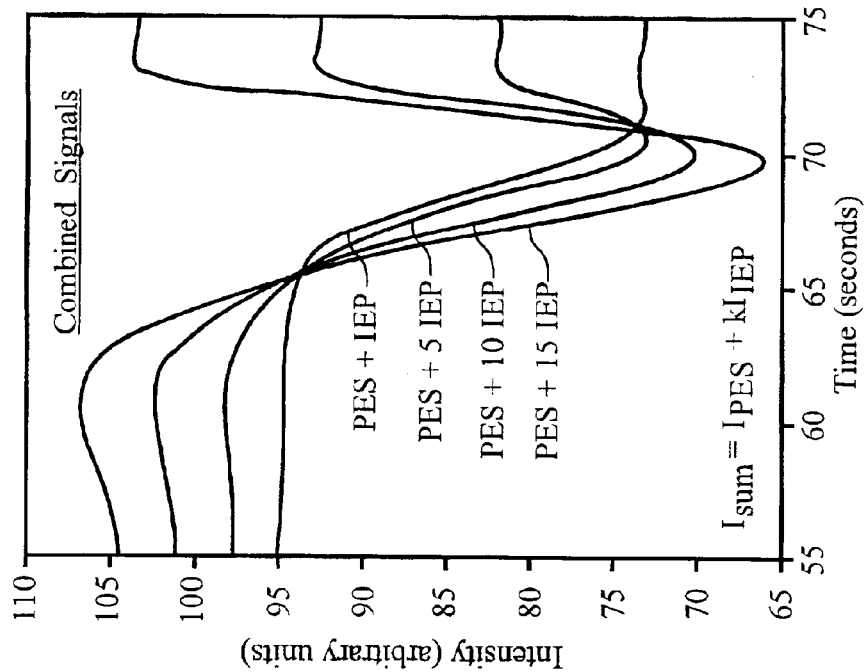
FIG. 8a is a graph showing the intensity of a wavelength of radiation reflected from the substrate (IEP— interferometric endpoint signal) and the intensity of a wavelength of radiation emitted from the plasma emission spectra (PES—plasma emission signal)
Figure 8A:
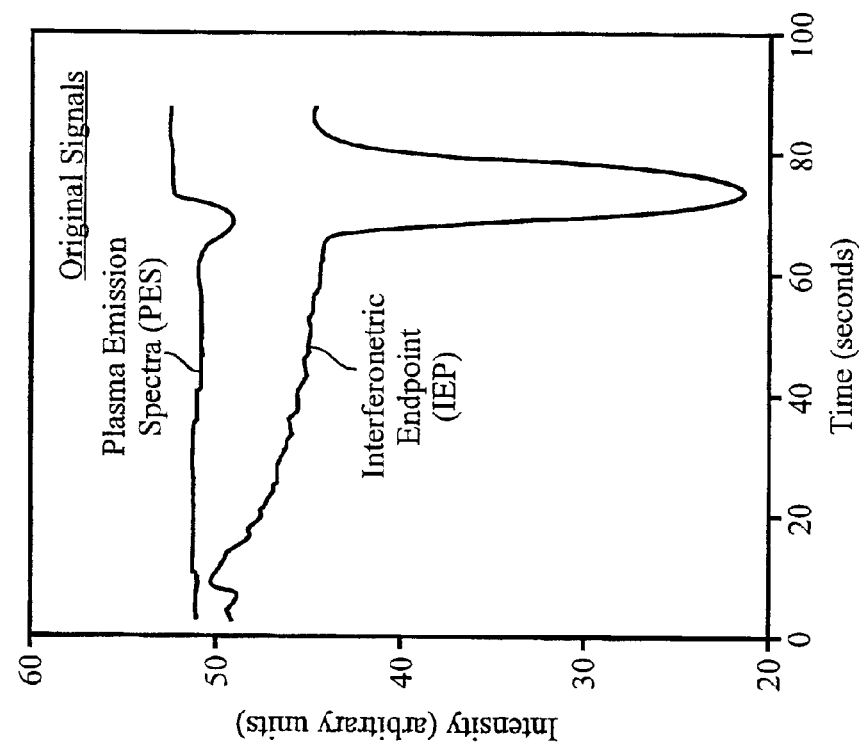
Figure 8D:
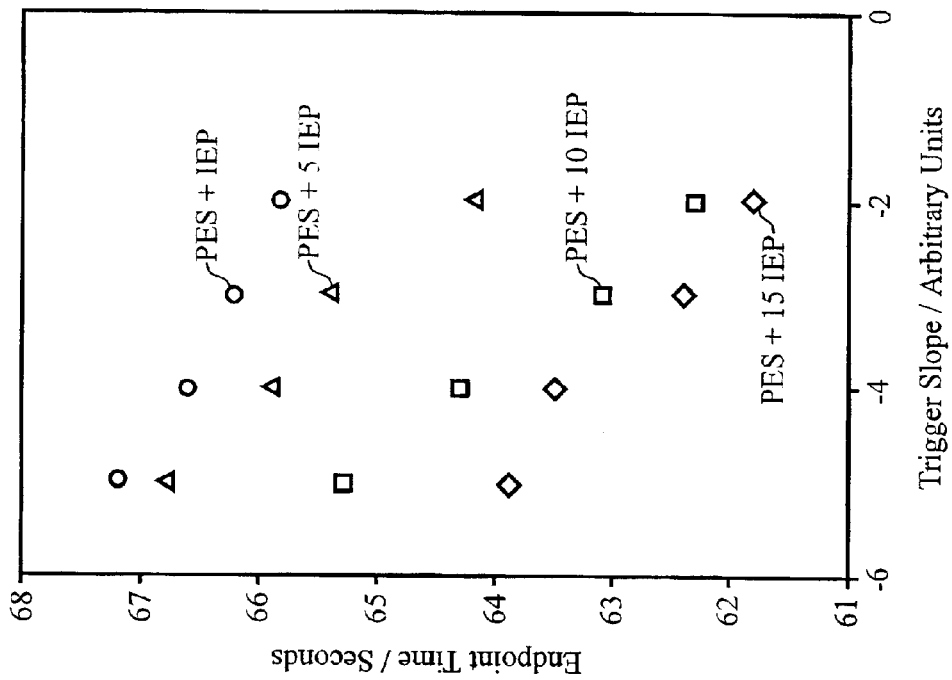
Figure 8C:
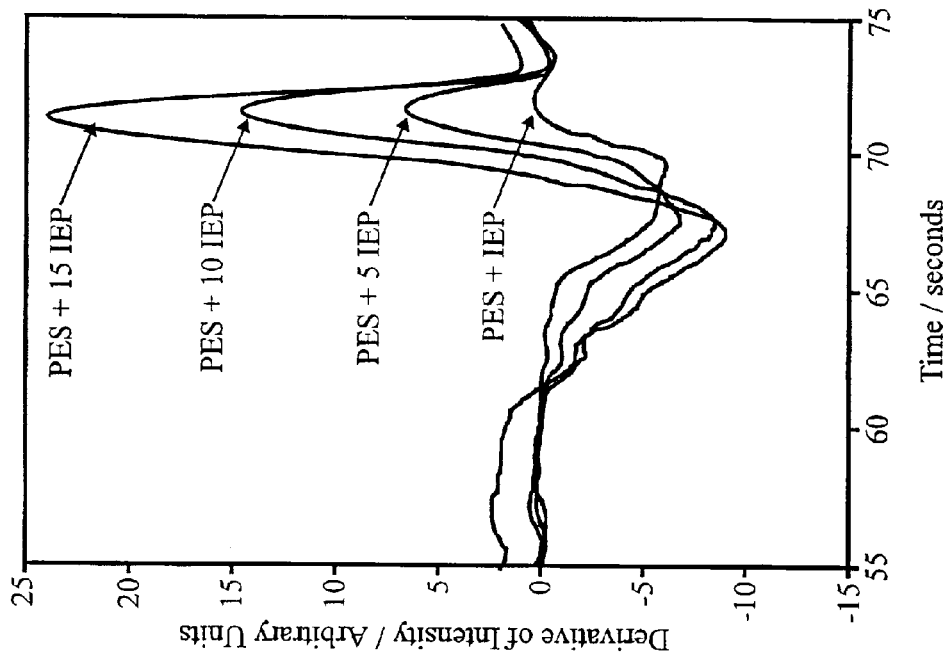
Figure 9:
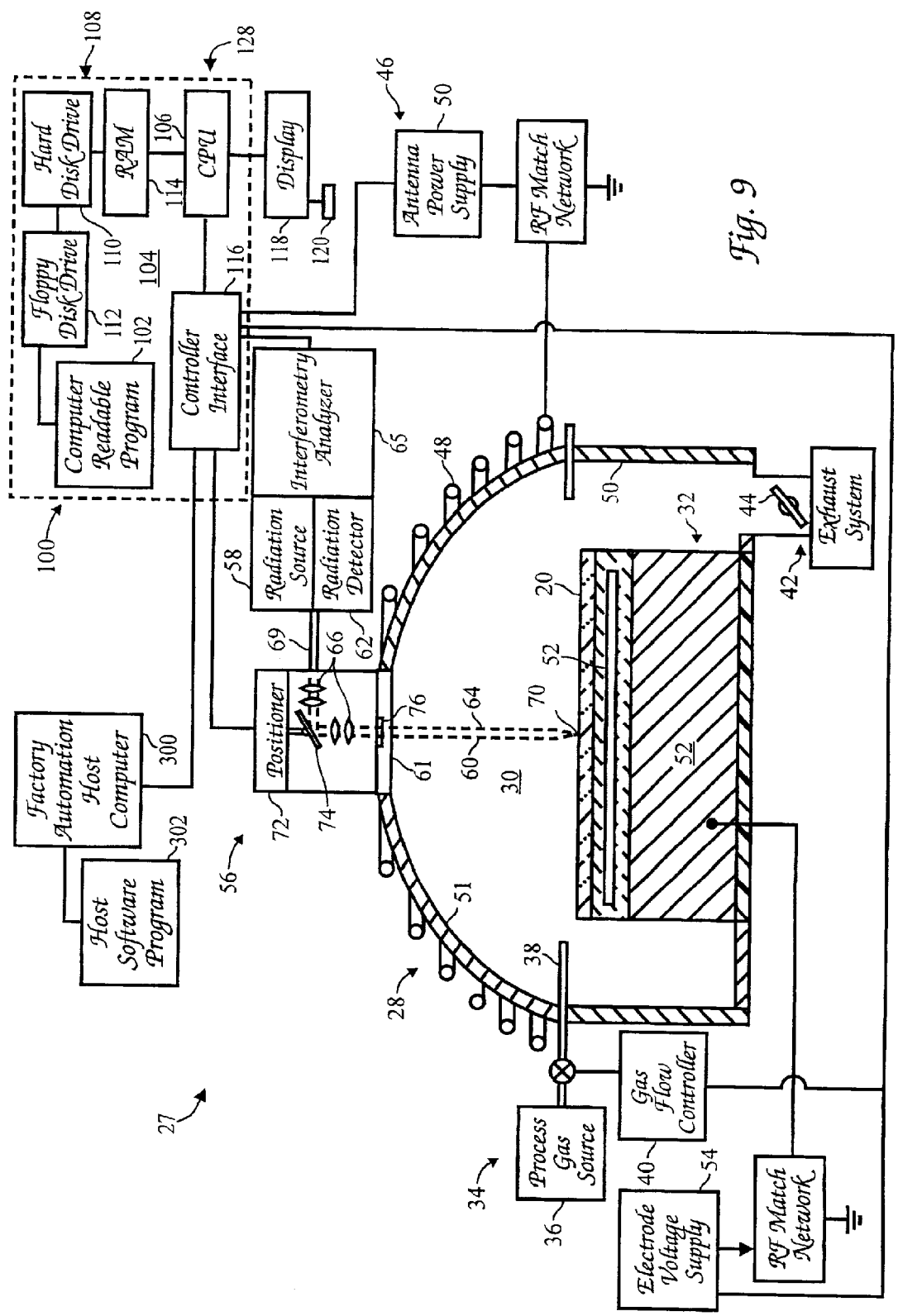
Figure 10:
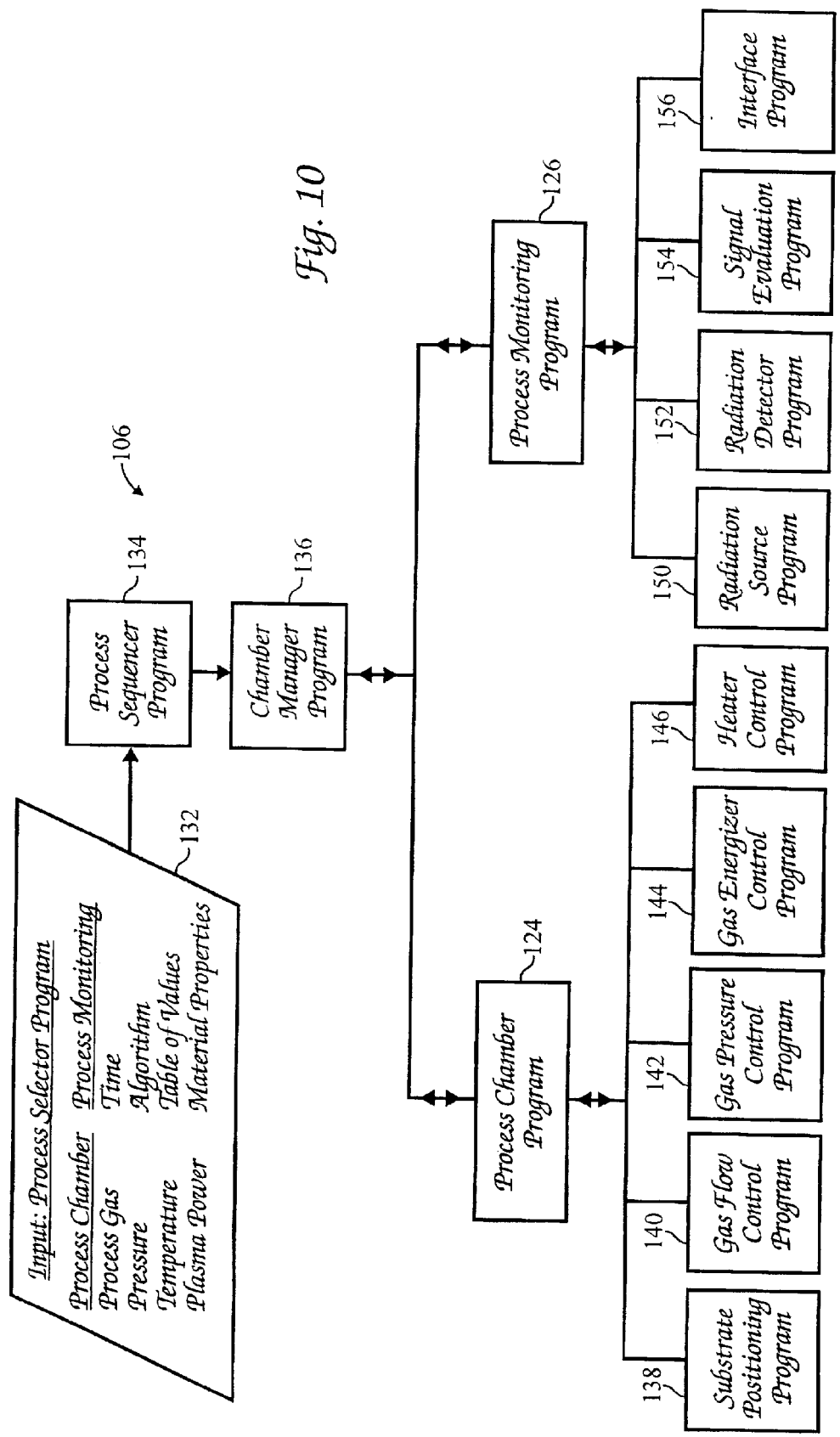

FIG. 8b is a graph showing a trace of combined values of the IEP and PES signals;

FIG. 8c is a graph showing the derivative of the combined values of the IEP and PES signals;

FIG. 8d is a graph showing process endpoint time for a polysilicon etching process as a function of the IEP factor k and the trigger slope;

FIG. 9 is a schematic sectional side view of a chamber and process monitoring system according to the present invention; and FIG. 10 is an illustrative block diagram of a structure of a computer program suitable for operating the chamber and monitoring a process performed therein.

DESCRIPTION

The present invention is useful for measuring a property of a material on a substrate 20, in situ, during processing of the substrate 20, or for detecting completion of a stage of processing of a material or a feature on the substrate 20. Referring to the exemplary embodiment shown in FIGS. 1a to 1c, a substrate 20 may comprise a plurality of materials 22, 24, formed on a wafer 26 comprising, for example, silicon, compound semiconductor or dielectric. During processing of the materials 22, 24 it may be desirable to stop processing upon reaching an interface 23 between the materials 22, 24 or after completion of processing of one or both of the materials 22, 24. For example, in an etching process, it may be desirable to stop etching after etching an overlying first material 22 or after etching through only a small portion of an underlying second material 24. As another example, when depositing one or more of the materials 22, 24 on the wafer 26 it may be desirable to stop the deposition process upon reaching a desired thickness of either of the materials 22, 24 or to change process conditions after one material 24 has been deposited to other process conditions suitable for depositing the other material 22. The following description illustrates examples of the present invention; however, the invention should not be limited to the examples provided herein, and the invention includes other applications as would be apparent to one of ordinary skill in the art.

Figure 1A:
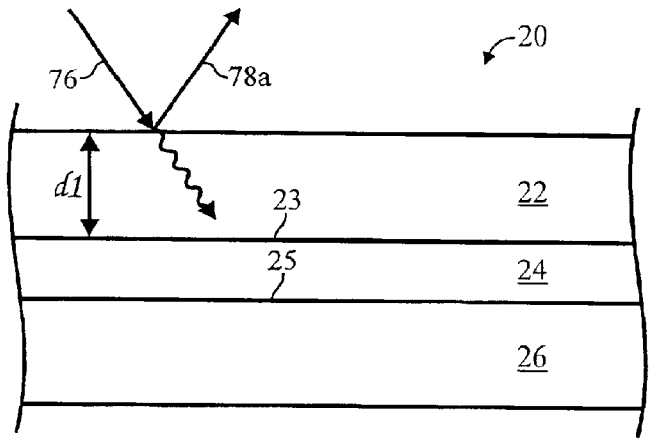
FIGS. 1a to 1c are schematic sectional views of a substrate showing the partial reflection and absorption of radiation during processing of the substrate.
Figure 1B:
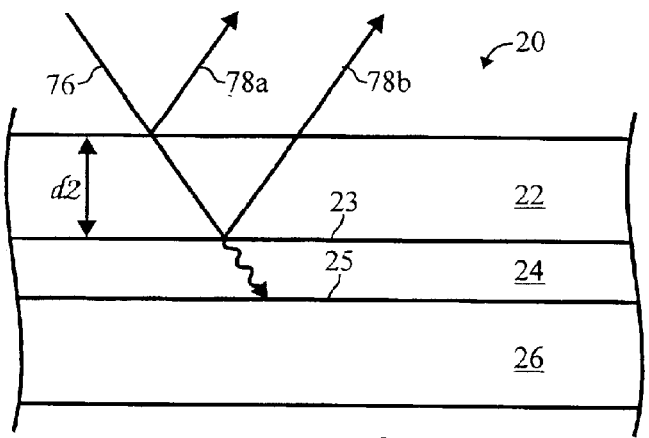
Figure 1C:
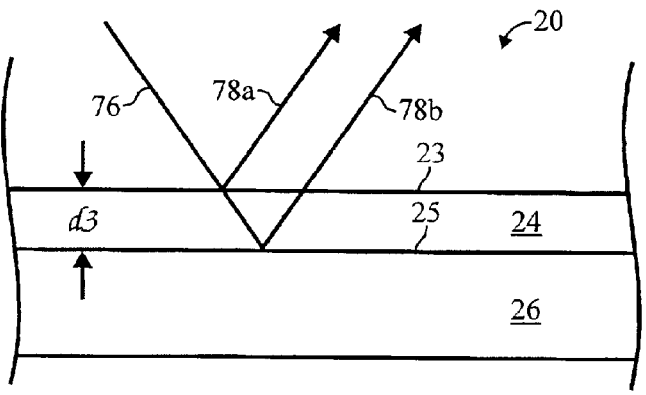

The present invention may be described referring to a typical etching process, in which a substrate 20 having the different layers 22, 24 is placed in a process zone and process conditions are set for etching the substrate 20. During the etching process, radiation incident on the substrate 20, is partially absorbed and partially reflected from one or more of the materials 22, 24 being processed on the substrate 20. Generally, when an optically absorbing material 22 lies on another material 24, the absorption and reflectivity of radiation may be approximately described by a summation equation. The radiation in the process environment of the chamber 28 that is incident on the material 22 has a first surface reflection determined by the complex Fresnel coefficient $r_1 = (n_0 - n_1)/(n_0 + n_1)$ where $n_0$ and $n_1$ are the complex refractive indices of media 0 and 1. The complex refractive index n is defined as $n = n - ik$ where n and k are the real and imaginary parts, being the refractive index and extinction coefficient, respectively. As illustrated in FIG. 1a, when the material 22 has a thickness d a portion of the incident radiation 76 is reflected as the component 78a and another portion may be transmitted into the material 22 according to the complex Fresnel transmission coefficient $t_1 = 2n_0/(n_0 + n_1)$. The transmitted radiation is absorbed in the material 22 as a function of a depth d by the factor $\exp(-4\pi k_1 d/\lambda)$ where $\lambda$ is the wavelength of the incident radiation. If the incident radiation has not been fully absorbed before reaching the interface 23 at the rear of the material 22 (FIG. 1b) some of the radiation is reflected back according to the equation, $r_2 = (n_1 - n_2)/(n_1 + n_2)$, where $n_2$ is the complex refractive index for material 22. The part of the reflection which remains after absorption during the round trip is transmitted back into the process environment, where it combines with the original reflected radiation, but with a phase change $\delta = 2\pi n_1 d_1/\lambda$ which depends upon the round trip distance covered. The net reflected amplitude is approximately, $r_{net} \cong r_1 + t_1 t_1' r_2 \exp(+2i\delta) \exp(-4\pi k_1 d/\lambda)$, where multiple reflections have been neglected. Explicit formulations may be found in references such as M. Born and E. Wolf, *Principles of Optics*, Pergamon Press (1965), which is incorporated herein by reference. When $d_1$ and $k_1$ are large enough, absorption dominates and the second term is zero, producing a constant net reflection as a function of thickness d. However, as d becomes smaller to $d_2$, as shown in FIG. 1b, for example, during the etching of the material 22, absorption no longer dominates and the intensity of the net reflected radiation is no longer constant as $d_2$ is varied. This variation comes from the changing phase and magnitude of the second term as $d_2$ is changed. Depending on the magnitude of $k_1$, the variation in total reflected intensity with $d_2$ can appear periodic, with increasing amplitude as $d_2$ tends to smaller values $d_3$ and eventually to zero. After the first material 22 is entirely removed, the incident radiation 76 may be partially reflected from the surface 23 as component 78a and partially transmitted through the material 24 and thereafter reflected from a second interface 25 between the material 24 and the wafer 26, as shown in FIG. 1c. The summation of the reflected components 78a, 78b result in another net amplitude of reflected radiation, that is different from the previously observed periodic variation in total reflected intensity. The change in amplitude of the net reflected component 78a, 78b is characterized by a constructive or destructive interference of the radiation component 78a reflected from the substrate surface and the radiation component 78b transmitted through a thickness of the material 24 and reflected from the underlying interface 25.

It has been discovered that the characteristics of temporal modulations in the properties of the reflected radiation, such as a change in amplitude of reflected radiation, may be monitored to determine a processing state or a property of a material 22 or 24. For example, the change in amplitude of the reflected radiation may be evaluated to determine an onset of etching of the second material 24 after the first material 22 is completely etched, a completion of etching of the second material 24, or some other property of the first or second materials 22, 24, including but not limited to, thickness, refractive index, reflectivity or other material properties. For example, in one aspect of the present invention, it has been found that a change in amplitude of reflected radiation that occurs during processing of the first and second material 22, 24, may arise from differences in reflectivity between the first material 22, second material 24, or their interface 23. For example, when radiation passes through the first and second material 22, 24, the second material 24 may have a different reflectivity function than the first material 22 which would cause a smaller or larger percentage of radiation to be reflected from the surface of the second material 24 than that reflected from the first material 22. In addition, the interface 23 may also have a different reflectivity function than the materials 22, 24 which would affect the amount of radiation reflected from the interface 23.

As another example, the amplitude of reflected radiation may also change relative to a change in pathlength of the radiation in the first material 22 or the second material 24. For example, as the first or second material 22, 24 is etched away, the portion of the material remaining on the substrate 20 becomes smaller to provide an ever smaller pathlength for the radiation transmitted through the remaining material and reflected from any underlying interface. The changing pathlength results in a changing phase relationship between the surface reflected wavefront and other internally reflected wavefronts to provide a temporal modulation of the intensity of the reflected radiation 78. These temporal modulations may be evaluated and deciphered to determine an onset and completion of processing of underlying or overlying material 24, 22, or a property or other attribute of the material being processed or other underlying or overlying materials.

Figure 2:
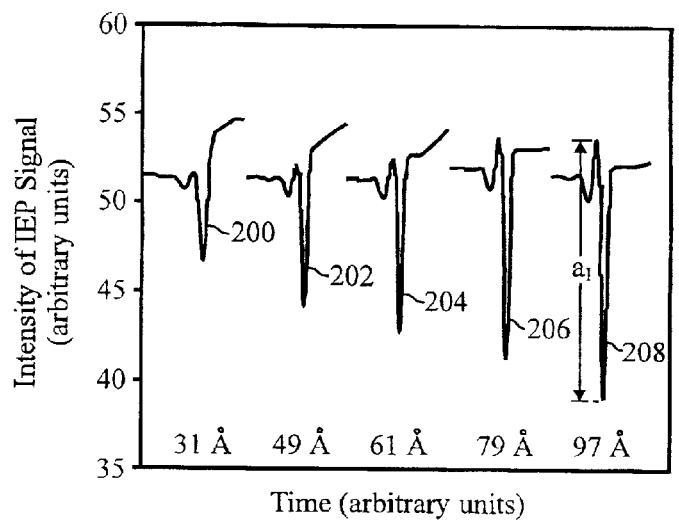
FIG. 2 is a graph of partial traces of the amplitude of reflected radiation obtained during etching of doped polysilicon overlying dielectric, showing the change in amplitude obtained for different thicknesses of underlying dielectric.
Figure 3:
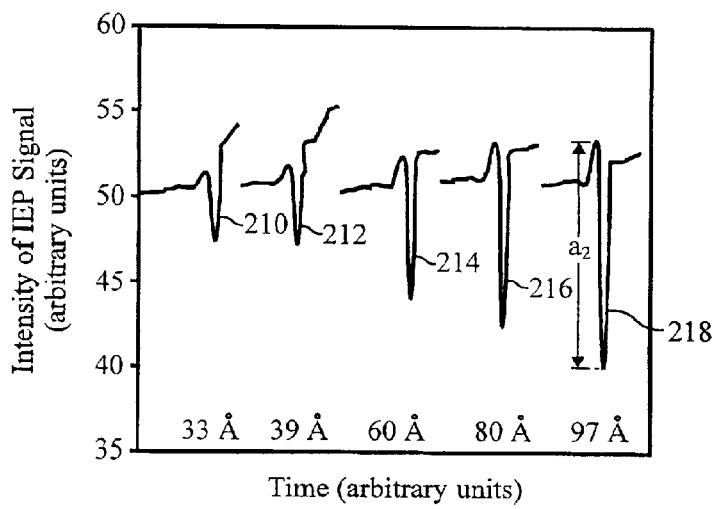
FIG. 3 is a graph of partial traces of the amplitude of the reflected radiation obtained during etching of undoped polysilicon overlying dielectric, also showing the change in amplitude obtained for different thicknesses of underlying dielectric.
Figure 4:
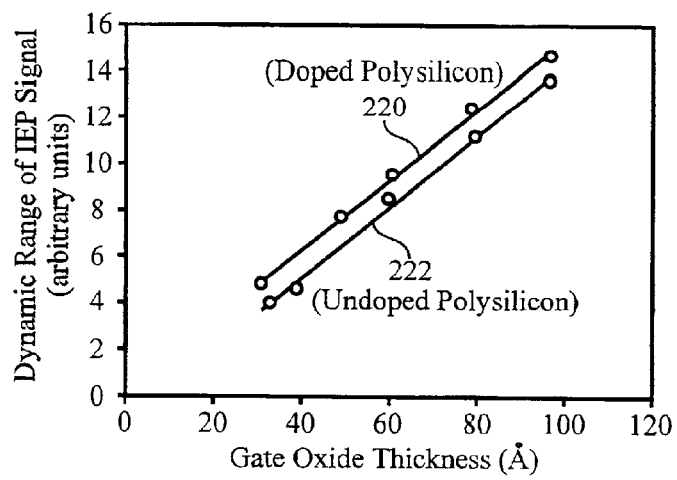
FIG. 4 is a plot of the change in dynamic variance of the amplitude of reflected radiation for different thicknesses of dielectric below doped and undoped polysilicon.

In one aspect of the present invention, as illustrated in FIGS. 2 to 4, the traces of the amplitude of reflected radiation (IEP—interferometric endpoint signal) may be used to calculate or estimate a property of the underlying material 24, such as its thickness, that is below a material 22 being etched. In these examples, radiation comprising ultraviolet light was directed onto the substrate 20. A wavelength of 365 nm was chosen to irradiate the substrate 20 because it is one of the peak amplitudes of radiation of the emission spectra from a conventional mercury discharge lamp, as shown in FIG. 5. The end portions of a number of traces of the amplitude of reflected radiation obtained during etching of a doped polysilicon material 22 overlying a dielectric material 24, are shown in FIG. 2. These trace segments were extracted close to the end of the polysilicon etching process when the overlying polysilicon material 22 was almost etched through. However, each trace segment was obtained during etching of polysilicon overlying dielectric material having a different thickness. Thus, the first trace segment 200 was obtained when the underlying dielectric material comprised a layer having a thickness of 31 Å, the second trace segment 202 was obtained when the dielectric layer was 49 Å thick, and so on for the segments 204, 206, and 208. It was discovered that each of these trace segments exhibited different dynamic variances of amplitude—which is the change in amplitude over a predefined time period of the amplitude trace, for example, the amplitude change $a_1$ in the trace labeled 208—toward the end of etching of the overlying polysilicon material. In addition, the shape of the trace segment may also change (not shown). The shape of the trace segment or the dynamic variance may be used to determine, non-destructively, and in situ during the etching process, the thickness of underlying oxide material 22.

FIGS. 2 and 3 further demonstrate that the trace segment or a dynamic variance value may also change depending on a property of the overlying material 22, such as for example, whether the overlying material 22 is doped or undoped. FIG. 3 shows the trace segments of reflected radiation obtained during etching of an undoped polysilicon material 22 overlying dielectric 24. The first trace segment 210 was obtained when the underlying dielectric had a thickness of 33 Å, the second trace segment 212 was obtained when the dielectric was 39 Å thick, and so on for the segments 214, 216, and 218. It was discovered that each of these trace segments exhibited different dynamic variances of amplitude, for example, the amplitude change $a_2$ in the trace labeled 218 for undoped polysilicon etching had a different value than the amplitude change $a_1$ in the trace labeled 208 for doped polysilicon etching. This change in the dynamic variance value may be used to determine, non-destructively, and in situ during the etching process, whether the overlying polysilicon material 22 is doped or undoped, and also to determine the level of dopant in the polysilicon material 22.

It was further discovered that the magnitude of the amplitude change observed in the trace of reflected radiation is related to the thickness of the underlying material, and within a certain range of thicknesses, the magnitude of the change in amplitude is directly proportional to the thickness of the dielectric material, for example, a gate oxide, isolation oxide or other material. FIG. 4 shows a graph of trace segments 220, 222 of the dynamic variance of the reflected radiation obtained for etching doped and undoped polysilicon material, respectively, over underlying dielectric material 24. Either trace 220, 222 may be analyzed to determine the mathematical relationship between the change in amplitude of the reflected radiation and the thickness of the underlying material 24. In fact, the change in amplitude was found to be a linear function of the thickness of the underlying dielectric in the range of thicknesses of about 30 to 90 Å. However, it is expected that as the thickness increases the amplitude may not change as much, or the rate of change of amplitude as a function of thickness will decrease and eventually become a straight line, for thickness exceeding about 1,000 Å. In addition, there is a noticeable difference in the change in amplitude between doped and undoped polysilicon, which may also be used to obtain information about the nature of the etching material, such as for example, the dopant level in the underlying material 24.

Thus, a device such as a controller 100 (which may be a computer or a separate hardware component, as illustrated in FIG. 9) may be adapted to receive an interferometric endpoint signal (IEP), determine the thickness of a material on the substrate 20, the level of dopant in the material, or some other property, and then take some action based upon the value of the property. At the beginning of the etching process, this is useful to allow non-destructive evaluation of a property of a material 22, 24 on the substrate 20 before the material is etched. For example, the thickness or dopant levels may be determined by comparing the measured dynamic variance value with other predetermined values, for example, stored in a memory of a computer as a table. The controller 100 is further adapted to provide an instruction signal to other chamber components, for example a robot transfer arm, to remove the substrate 20 from the chamber, or to end processing of the substrate 20, upon a determination of an unsuitable thickness of a material on the substrate 20. The substrate evaluation and instruction signal may be provided at the beginning of processing the substrate 20 as a quality control check to determine if substrate 20 is suitable for further processing or not, during processing to determine if the substrate should continue processing or to adjust process conditions according to the detected property of the material on the substrate 20, or after processing is completed to determine the suitability or other attributes of further processes being conducted on the substrate 20.

The change in amplitude or dynamic variance of the reflected radiation may also be used to estimate the thickness of the underlying dielectric material 24, and to determine if there is any deviation in thickness from substrate to substrate or across a batch of substrates 20, for quality control purposes. For example, a substantially constant dynamic variance may be determined as a reference point for a batch of substrates 20. When future measurements on other batches deviate from this reference value, it may mean that the thickness of the underlying dielectric 24 has changed thereby indicating a problem with the batch of substrates 20. It also provides a method of monitoring the repeatability of the thickness of the underlying dielectric 24 from substrate to substrate simply by measuring the dynamic variance of the reflected signal that occurs close to the etching endpoint, correlating the amplitude change for each substrate 20, or by determining the variation in amplitude change from substrate to substrate or from one batch of substrates to another batch. Instead of making the amplitude change measurements at the etching or deposition endpoint, the amplitude change measurements could also be made at the beginning of the etching or deposition process, for example, when the reflected radiation begins to demonstrate constructive and destructive interference to provide a quality control method for determining the thickness of an underlying layer 24 before the overlying layer 22 is processed.

Thus, the present method may serve as a means for non-destructive evaluation of a property of a material 22, 24 deposited upon, or a feature being constructed in, the substrate 20. The non-destructive evaluation may be performed in-situ in the chamber, and before, during, or after processing of the substrate. The evaluation information may be used to remove the substrate 20 from the chamber without processing it, change process conditions, or relay information about the substrate 20 after processing which is useful for further processing steps or for improving the process being operated.

In another example, the method may be used for the quality control evaluation of an entire shallow trench isolation process sequence. For example, in the trench etching and filling process, the thickness of the material deposited on the substrate 20 may be evaluated before, after, or during processing. If the thickness of a material comprising an insulator layer deposited over a conductor is too thin, it may result in an electrical breakdown through the insulator layer. The threshold voltage at which the transistor devices turn on, is related to the thickness of the insulator layer, and a constant threshold voltage is desirable to obtain uniform electrical properties from substrate to substrate. Traditionally, the threshold voltage is measured only after completion of processing of the substrate—using testers and probing devices. In contrast, the present method provides means for determining the thickness of the insulator layer in-situ in the chamber and before completion of processing, so that appropriate remedial measures or other processing changes may be taken, so that the substrate may be scrapped without completing further process steps, or to provide information useful for further processing steps. The extra tests to determine the thickness of the insulator layer may be also eliminated by obtaining the thickness information in-situ during processing.

As another example, in the shallow trench etching process, the IEP signal may originate from the oxide material used for isolation of the shallow trenches. Such an IEP signal may be used to provide information about the shallow trench depth, top and bottom corner rounding, dielectric fill depth, and the dielectric polish or anneal requirements. The trench depth may be evaluated from the change in intensity of the radiation reflected from the bottom of the trench that results from the interaction of the radiation with the dielectric material at the bottom of the trench. The top and bottom corner trench rounding is the rounding of corners that results during etching of the trench. The trench corner rounding may be detected because rounding of corners results in a different isolation dielectric thickness at a trench edge as the isolation dielectric thickness at the bottom of the trench. The different thicknesses of isolation dielectric causes the reflected radiation to have a different interferometric signal strength than the radiation reflected from a trench corner that is not rounded, which is detectable upon recognizing a difference in signature of the IEP signal that results when the trenches have rounded corners. Similarly the dielectric fill depth in the trench may also be evaluated. The average thickness of the isolation dielectric, and optionally, its surface characteristics, may also be evaluated to determine the dielectric polish or anneal requirements, for example, the length of time and abrasive requirements for chemical-mechanical polishing of the dielectric or the annealing time and temperature.

The present method may also be used to monitor the thickness of a material previously deposited on a substrate, in processes such as, and without limitation, CVD, PVD, oxidation and nitridation processes. In such processes, the method is used to detect completion of a process of forming a layer of material 22 on a layer 24 of the substrate 26 to measure the thickness of the layer 24. In these processes, the amplitude of a trace of the intensity of the reflected radiation 64 gradually decreases to indicate the approaching endpoint of the process, in a reverse sequence to that shown in FIGS. 1b and 1c. Initially, radiation that is incident upon the substrate 20 is reflected by the surface 23 of the material 22 being deposited on the substrate 20, because the material 22 only has a thickness $d_3$ that is sufficiently small to be substantially non-absorbing or absorbing only to a small degree (not shown). However, as the thickness of the material 22 begins to increase during the deposition process, the incident radiation continues to be partially reflected from the surface 23 of the material 22 and partially reflected from the underlying interface 25, as illustrated schematically in FIG. 1c. The reflected components 78a, 78b constructively or destructively interfere due to their difference in pathlengths to provide an interference fringe. However, upon approaching the endpoint of the process, the thickness of the material 22 being deposited now approaches a thickness level at which the transmitted component of the incident radiation 76 is substantially absorbed in the thickness of the deposited material 22, which may result in the disappearance of the interference fringe. In between, the interference fringe gradually decreases in amplitude. Thus a desired thickness of material deposition can be "dialed up" because the process is stopped simply when the desired height of the interference fringe is obtained. The fringe counting method could also be used because there is an accurate starting point, i.e., when d=0. However, the amplitude of the IEP signal for layer 22 (during deposition) tells us how thick the layer 24 is because the radiation travels through the underlying layer.

The depth of shallow trenches etched on the substrate 20 may also be measured non-destructively and before completion of the etching process. This is accomplished by measuring the radiation reflected from a selected portion of the substrate 20, (for example, by focusing a lens assembly of a radiation detector or an incident beam of radiation onto the particular substrate portion). A relevant portion of the substrate 20 may be a portion that contains deep or shallow trenches. By monitoring a change of a reflected radiation amplitude, the variation in oxide thickness at the bottom or the deep and shallow trenches may also be determined. Also, when the trenches are filled with oxide, the thickness of the oxide in the trench may be significantly higher than the thickness of the oxide outside the trench; thus, the amplitude change of the reflected radiation should be measured over an area encompassing a large number of trenches to get an average signal corresponding to the thickness of the oxide layer over this entire region and not just from either within or from outside a trench.

While the relationship between the amplitude change of reflected radiation during etching or deposition of material and a related property (such as thickness) of the underlying material may be established based on empirical data, it may also be estimated by calculating the values using a radiation absorption model based upon the appropriate parameters and assumptions, and knowing values for other parameters of the material 22, e.g., its composition, refractive index, extinction coefficient, thickness, and other radiation absorption and reflection constants; an etch rate and etching selectivity of the process; and an area of overlying mask material. A trace of the estimated amplitude changes may be mathematically calculated for a given thickness of underlying material and stored as a reference trace. The reference trace is evaluated or compared against an empirically determined signal trace to determine the requisite property of the material. In another version, a table of calculated or estimated values of the amplitude change of reflected radiation may be used to predict the property of the material for a measured change in the amplitude of reflected radiation.

For the processing of more complex systems comprising multiple materials having different compositions, such as a multicomponent polycide material comprising tungsten silicide deposited over polysilicon, the reflected trace will exhibit the same general behavior, but can be more precisely modeled by a mathematical matrix in which each component of the multicomponent material may be represented by a 2×2 matrix that is used to calculate the total absorption/reflectivity of the material. The matrix comprises an array of values representing the total absorption or reflectivity obtained in each component of the material on the substrate 20, and it may be calculated or experimentally determined to evaluate the change in amplitude of the thickness of one or more materials being processed. Lateral differences in the multicomponent material that arise from the features formed in the material can also be accounted for by summing the complex reflected amplitudes vectorially with phase for each multicomponent material to determine the total reflected intensity change occurring when the radiation is transmitted through the material. Alternatively, a recursive method may also be used to model a trace of reflected radiation intensity changes from such materials.

In another aspect of the present invention, the amplitude of the reflected radiation is analyzed to determine an onset or a completion of processing of a material on the substrate 20, or both an onset and completion of processing of one or more materials on the substrate 20. Generally, the substrate 20 comprises first and second materials 22, 24, which may be processed in the same process or chamber. In these applications, it may be desirable to determine completion of a stage of processing or onset of processing of one of the two materials 22, 24. In one version, the first material 22 is processed and at the end of processing of the first material 22, an onset of processing of the second material 24 is detected. Thereafter, a completion of processing of the second material 24 may also be determined. This method is useful, for example, to determine a stage of processing of a second material 24 that forms a layer below the first material 22.

Figure 6D:
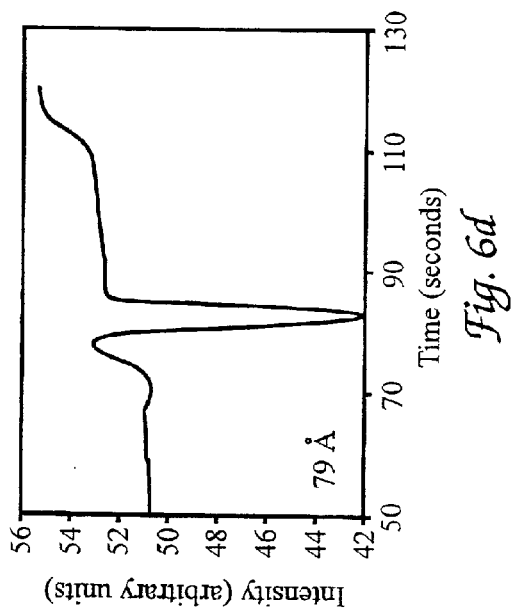

The onset or completion of processing of the second material 24 may also be determined from a change in the amplitude of the reflected radiation that occurs toward the end of processing of the first material 22. The change in amplitude may result from a difference in reflectivity of the first or second materials 22, 24, or from the reflectivity of the interface 23; from a change in thickness of the first or second material 22, 24; or from a change in absorption of these materials. For example, FIGS. 6a through 6e, are graphs of the trace of an amplitude of reflected radiation toward the end of etching of overlying polysilicon material 22, showing the onset, etching, transition and completion of etching of underlying material 24. In one example, FIG. 6a shows the amplitude trace obtained during etching of polysilicon overlying a 31 Å thick underlayer. After a first stage I, in which a small maxima and subsequent dip in amplitude corresponds to completion of etching of the polysilicon layer, two additional distinct stages II & III corresponding to etching of the underlying material are observed. The gradual upward slope in stage II indicates etching of the dielectric material 24 and the horizontal portion of stage III indicates that the dielectric has completed etching. This type of amplitude curve may be used to detect the completion of etching of the over layer, onset of etching of the underlayer 24, and completion of etching of the underlayer 24. FIG. 6b is a similar amplitude trace obtained during etching of polysilicon overlying a 49 Å thick underlayer.

Figure 6E:
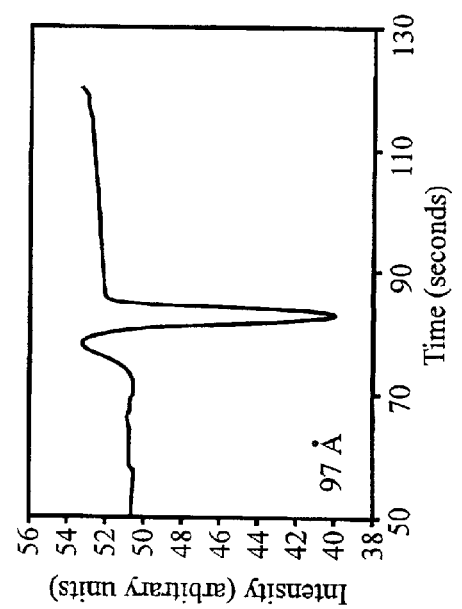

In another example, FIG. 6c shows a trace for etching polysilicon material 22 overlying a 61 Å thick dielectric layer 24 that has several distinctly different regions. In the first stage I, the polysilicon material 22 is etched to completion and is followed by the onset of etching of the underlying dielectric material 24. At this time the trace changes essentially from a straight line to a first peak having a maxima and immediately after to a second peak which is a minima. The rapid transition occurs because the polysilicon material 22 being etched is sufficiently thin near the end of the etching process to allow the incident radiation to be at least partially transmitted therethrough. Thereafter, continued etching of the underlying dielectric material 24 may be observed by the plateau (stage II) of the trace. Toward the end of etching of the dielectric material 24, the trace slopes upward while a transition layer below the dielectric material 24 is being etched (stage III). In the final stage IV, all the dielectric material 24 is etched through and the trace of reflected radiation flattens out into a plateau. FIGS. 6d and 6e are similar traces obtained during etching of polysilicon overlying 79 and 97 Å thick underlayers, however, in FIG. 6e, the final plateau stage is not seen because the trace was stopped before the end of etching of the relatively thick polysilicon layer.

Thus, FIGS. 6a through 6e show similar sets of features and attributes that may be characteristic and repeatable in the transition from etching of polysilicon 22 to etching of underlying dielectric 24. However, each figure is a trace for a different thickness of underlying dielectric, and each of the traces have slightly different shapes and features. Thus, the traces of the transition for etching polysilicon to etching of dielectric may be empirically determined prior to the actual etching process to allow real time evaluation of the traces and correlation of the observed features to the sequence of actual events occurring during processing, such as the onset of etching of an underlying layer or the completion of etching of the same layer or another layer. The multiple stages observed during the etching process may be used to identify the properties of the overlayer 22 or underlayer 24, such as the thickness of the layers, or the nature or other properties of the layers. Also, identification of the different stages allows the operator to determine when the dielectric 24 is fully cleared (completely etched through) to stop the etch process as required in certain gate etch applications, o when it reaches a predetermined thickness. This is significant improvement over prior art processing methods which often relied on predetermined etch-through time periods to guess when the dielectric or ONO layer was etched through.

The data presented in the graphs of FIGS. 6a to 6e may also be used to qualitatively characterize a material 22, 24 on the substrate 20. For example, the amplitude or signal data may be used to at least qualitatively determine the crystalline, microstructure, porosity, electrical, chemical or compositional property of the material; or if there are any variations in the properties of the materials 22, 24. When there are variations in these properties (which may occur during the deposition process), the present method may be used to detect such variations by comparing the signal trace obtained from one substrate 20 to another in the same batch, or by comparing an averaged signal traces of different batches of substrates 20. If the slope or the shape of the signal trace varies, it may indicate a variation in a property of the material 22, and this information may be used to stop the process, alter process conditions, or change or correct earlier process conditions. For example, when the time taken to reach the plateau at the end of the traces in FIGS. 6a through 6e is recorded as a function of chamber processing history, this memory effect can be determined and countermeasures may be taken to reduce the buildup of undesirable residual species in the chamber.

Figure 7:
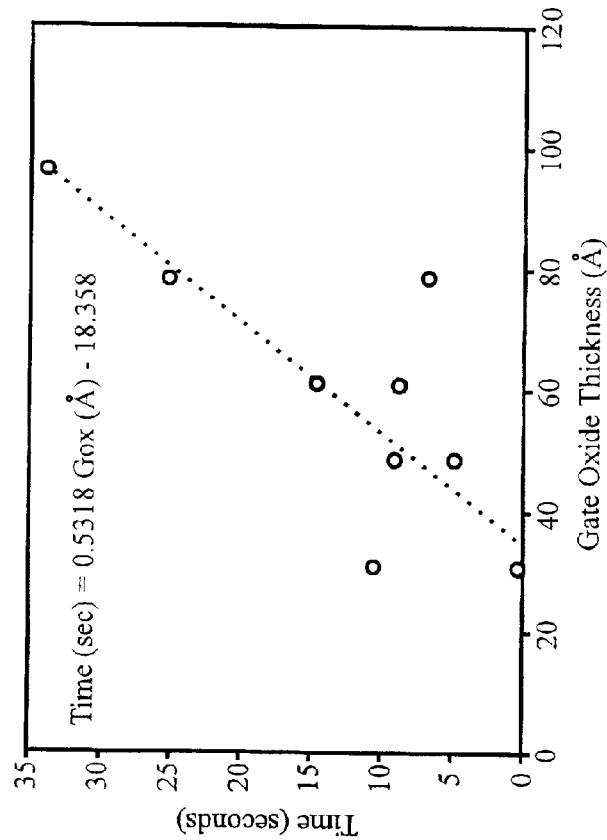
FIG. 7 is a plot of etching time periods obtained for etching dielectric layers having different thicknesses.

As another example, FIG. 7 is a plot of the duration of the dielectric etching and transition periods as a function of the thickness of a dielectric material. The slope of the curve 29 may be used to determine a rate of etching of the dielectric material of about 113 angstroms/minute. Provided the plasma process conditions are the same, the rate of etching should remain the same from one substrate 20 to another, and the etching rate may be a useful quantitative measure of the properties of the material 22 deposited on the substrate 20. Also, the rate of etching may provide insight into possible "process memory" effects in the chamber. Any residual fluorine in the chamber will increase the dielectric etch rate and this effect may be detected from the shape and properties of the radiation trace.

In another aspect, the present invention is used to detect both the radiation emitted from the plasma and the radiation reflected from the substrate 20. This version comprises one or more radiation detectors to detect a radiation emission from the plasma and generate a first signal, and to detect a radiation reflected from the substrate 20 and generate a second signal. A controller may be adapted to receive the first and second signals, and to evaluate the signals to determine the occurrence of an event in the chamber or a property of a material on the substrate 20. For example, the first and second signals may be evaluated to determine an onset of processing of a material on the substrate 20, for example, an onset of processing of the underlayer 24 while an overlayer 22 is being processed.

In one version, the controller 100 may be adapted to combine the first and second signals. For example, FIG. 8a shows two traces of the intensity of a wavelength of radiation reflected from the substrate and of the intensity of a wavelength of radiation emitted from the plasma, during etching of a polysilicon material 22. It is believed that the reason for the time discrepancy is that IEP may be used to detect the endpoint locally while the plasma emission signal (PES) arises as soon as any portion of the wafer is etched to the underlayer. A minima peak occurs in the IEP trace for reflected radiation due to destructive interference of a radiation component reflected from the surface of the polysilicon layer 22, and one or more other radiation components transmitted through a thickness of the layer and reflected from an underlying interface 23 toward the end of the polysilicon etching process.

FIG. 8b shows a trace of the combined amplitude of the reflected and emitted radiation. The amplitude for the PES plasma emission trace is added to the amplitude of the IEP reflected radiation trace multiplied by a factor k ranging from 1 to 15. The factor k was used as a weighting factor. A large factor k gives the resulting trace more properties of the signal of the IEP reflected radiation signal while for small k the plasma emission characteristics are dominant. It is seen that the combined signal $I_{SUM}$ starts to decrease first when the factor k for the reflected radiation is the largest (PES+15IEP—in FIG. 8b). This enables adjustment of the predictive qualities of the endpoint signal with great flexibility by adjusting k. The portion of the emissions signal $I_{PES}$ that is part of $I_{SUM}$ ensures that process endpoint (for very weak IEP signals) is detected at the latest when the plasma emission starts to change.

In another example, FIG. 8c shows the derivative of the combined trace $I_{SUM}$ of the reflected and plasma emitted radiation. In this version, the controller is adapted to evaluate a derivative of the combined first and second signals. This graph shows that the slope starts to change first for the signal with the largest contribution of $I_{IEP}$ (increased predictive qualities). This is useful because a slope may be selected at which the etch process may be terminated. As can be seen in FIG. 8c, this slope will be reached first for the largest value if k.

This is demonstrated in more detail in FIG. 8d. This figure shows a process endpoint time for a polysilicon etching process as a function of an IEP factor k and trigger slope. It becomes clear that the endpoint is triggered earlier with smaller trigger slopes, and as the signal to noise ratio becomes larger, the probability of determining a false endpoint may increase. Alternatively, one can trigger endpoint earlier (and therefore protect a thin dielectric layer better from an aggressive main etching process step) as the k factor is increased. In summary, the proper selection of trigger slope and k factor allows development of reliable and repeatable predictive endpoint algorithms.

The examples provided herein, may be used, for example, in the etching of a substrate 20 in an apparatus 27 that is schematically illustrated in FIG. 9. Generally, the apparatus 27 comprises a chamber 28 having a process zone 30 for processing the substrate 20 and a support 32 to receive the substrate 20 in the process zone 30. Process gas is introduced into the chamber 28 through a gas supply 34 comprising a gas source 36, gas outlets 38 located around the periphery of the substrate 20 (as shown) or in a showerhead mounted on the ceiling of the chamber (not shown), and a gas flow controller 40 is used to control the flow rate of the process gas. Spent process gas and etchant byproducts are exhausted from the chamber 28 through an exhaust 42 comprising roughing and turbomolecular pumps (not shown) and a throttle valve 44 may be used to control the pressure of process gas in the chamber 28.

An energized gas or plasma is generated from the process gas by a gas energizer 46 that couples electromagnetic energy, such as RF or microwave energy, to the process gas in the process zone 30 of the chamber 28, such as for example, an inductor antenna 48 comprising one or more coils 49 powered by an antenna power supply 50 that inductively couples RF energy to process gas in the chamber 28. In addition or as an alternative chamber design, a first process electrode 51 such as an electrically grounded sidewall of the chamber 28 and a second electrode 52 such as an electrically conducting portion of the support 32 below the substrate 20 may be used to further energize the gas in the chamber 28. The first and second electrodes 51, 52 are electrically biased relative to one another by an RF voltage provided by an electrode voltage supply 54. The frequency of the RF voltage applied to the inductor antenna 48 and/or to the electrodes 51, 52 is typically from about 50 KHz to about 60 MHz.

The chamber 28 further comprises an process monitoring system 56 to monitor the process being performed on the substrate 20. The process monitoring system 56 comprises a radiation source 58 that may be outside or inside the chamber 28. The radiation source 58 may provide radiation such as ultraviolet (UV), visible or infrared radiation; or it may provide other types of radiation such as X-rays. The radiation source 58 may comprise, for example, an emission from a plasma generated inside the chamber 28, the plasma emission being generally multispectral, i.e., providing radiation having multiple wavelengths extending across a spectrum. The radiation source 58 may also be positioned outside the chamber 28 so that a radiation beam 60 may be transmitted from the source 58 through a window 61 and into the chamber 28. The radiation source 58 may also provide radiation having predominant wavelengths, or a single wavelength, such as monochromatic light, for example, a He-Ne or Nd-YAG laser. Alternatively, the radiation source 58 may provide radiation having multiple wavelengths, such as polychromatic light, which may be selectively filtered to a single wavelength. Suitable radiation sources 58 for providing polychromatic light include Hg discharge lamps that generate a polychromatic light spectrum having wavelengths in a range of from about 180 to about 600 nanometers; arc lamps such as xenon or Hg—Xe lamps and tungsten-halogen lamps; and light emitting diodes (LED).

In one version, the radiation source 58 provides a source of non-polarized light, such as ultraviolet, infrared or visible light. One reason is that variations in the intensity of polarized radiation reflected from the substrate 20 can be masked by the changing absorption characteristics of the energized gas or plasma. In addition, the state of polarization of the radiation also influences its absorption in materials having oriented crystalline structures, such as crystals having other than cubic symmetry. The polarization state of the radiation can change when it passes through a thin residue film that deposits on the window 61 of the chamber 28 during the process, and the polarization state also changes as the thickness of the residue film increases, which gives rise to erroneous measurements. Thus, for certain processes, depending on the process gas composition and the location of the source of radiation, it may be desirable to use a radiation source 58 providing unpolarized radiation. A normal incidence of the radiation onto the substrate 20 can also reduce adverse measurement effects. For example, normal incidence may provide a more accurate endpoint reading for a substrate 20 having tall and narrowly spaced features, such as resist features, over the layers 22, 24, because the normally incident radiation is not blocked from reaching the layers 22, 24 by the height of the resist features. However, it should be understood that normal incidence is not necessary for detection of the reflected radiation and that other angles of incidence may be employed.

The process monitoring system 56 further comprises a radiation detector 62 for detecting radiation 64 reflected by the substrate 20. The radiation detector 62 comprises a radiation sensor, such as a photovoltaic cell, photodiode, photomultiplier, or phototransistor, which provides an electrical output signal in response to a measured intensity of a reflected beam of radiation 64 (or an emission spectra from the plasma). The process monitoring system can include an interferometry analyzer 65 to analyze the electrical output signal from the radiation detector 62. The signal may comprise a change in the level of a current passing through an electrical component or a change in a voltage applied across an electrical. A sultable system for coupling the radiation detector 62 to the chamber 28 comprises a fiberoptic cable 69 leading to the sensor of the radiation detector 62.

Optionally, a lens assembly 66 may be used to focus a radiation beam 60 emitted by the radiation source 58 into the substrate 20, or to focus a radiation beam 64 reflected back form the substrate 20 onto the sensor of the radiation detector 62. For example, for a radiation source 58 comprising a Hg-discharge lamp located out the chamber 28, the lens assembly 66 may comprise a plurality of convex lenses that may be used to focus a radiation beam 60 form the lamp, through the window 61, and as a beam spot 70 on the substrate 20. The area of the beam spot 70 should be sufficiently large to provide an accurate measurement of the surface topography of the substrate 20. The lens may also be used to focus reflected radiation 64 back onto the sensor of the radiation detector 62 in the reverse direction which is especially useful when the radiation source 58 is an emission spectra from a plasma.

Optionally, a positioner 72 may be used to scan the incident radiation 60 across the substrate surface to locate a suitable portion of the substrate 20 on which to "park" the beam spot 70. The positioner 72 may comprise one or more primary mirrors 74 that can rotate at small angles to deflect radiation from the radiation source 58 onto different positions of the substrate surface (as shown). Alternatively, the mirrors 74 can also direct radiation emitted from a plasma emission and at least partially reflected off the substrate 20 back onto the radiation detector 62. Additional secondary mirrors (not shown) may be used to intercept and focus reflected radiation back on the radiation detector 62. The positioner 72 can also be used to scan radiation in a raster pattern across the substrate 20. In this version, the positioner 72 further comprises a movable stage (not shown) upon which the radiation source 58, lens assembly 66, and radiation detector 62 are mounted. The movable stage may be moved through set intervals by a drive mechanism, such as a stepper motor, that scans or otherwise moves the beam spot 70 across the substrate 20.

Radiation having a plurality of wavelengths, such as polychromatic light from a lamp or a plasma emission spectra, can be filtered by placing a filter 76 in the path of the incident or reflected radiation 60, 64. The filter 76 is typically located in the lens assembly 66 but can also be located at other positions in the chamber 28, for example, in the chamber window 61, in front of the radiation detector 62, or in front of the radiation source 58. A suitable filter 76 comprises thin films on a transparent support that selectively transmit radiation having the desired wavelength, a filtering lens, a diffraction grating having a diffraction spacing that scatters radiation having undesirable wavelengths, attenuation of radiation through a long pathlength in a partially absorbing material, or selective electronic filtering of the signal from the radiation detector 62 to read only the portion of the signal corresponding to radiation having the desired wavelength.

The chamber and endpoint detection system 56 is operated by a controller 100 that executes a computer-readable process control program 102 on a computer system 104 comprising a central processor unit (CPU) 106, such as for example a 68040 microprocessor, commercially available from Synergy Microsystems, California, or a Pentium Processor commercially available from Intel Corporation, Santa Clara, Calif., that is coupled to a memory 108 and peripheral computer components. The memory 108 comprises a computer-readable medium having the computer-readable program 102 embodied therein. Preferably, the memory 108 includes a hard disk drive 110, a floppy disk drive 112, and random access memory 114. The computer system 104 further comprises a plurality of interface cards including, for example, analog and digital input and output boards, interface boards, and motor controller boards. The interface between an operator and the controller 110 can be, for example, via a display 118 and a light pen 120. The light pen 120 detects light emitted by the monitor 118 with a light sensor in the tip of the light pen 120. To select a particular screen or function, the operator touches a designated area of a screen on the monitor 118 and pushes the button on the light pen 120. Typically, the area touched changes color, or a new menu is displayed, confirming communication between the user and the controller 110.

Computer-readable programs such as those stored on other memory including, for example, a floppy disk or other computer program product inserted in a floppy disk drive 112 or other appropriate drive, or stored on the hard drive, may also be used to operate the controller 100. The process control program 102 generally comprises process control software 124 comprising program code to operate the chamber 28 and its components, process monitoring software 126 to monitor the processes being performed in the chamber 28, safety systems software, and other control software. The computer-readable program 102 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 108 of the computer system. If the entered code text is in a high level language, the code is compiled, and the resultant compiler code is then linked with an object code of pre-compiled library routines. To execute the linked, compiled object code, the user invokes the object code, causing the CPU 106 to read and execute the code to perform the tasks identified in the program.

FIG. 10 is an illustrative block diagram of a hierarchical control structure of a specific embodiment of a process control program 102 according to the present invention. Using a light pen interface, a user enters a process set and chamber number into a process selector program 132 in response to menus or screens displayed on the CRT terminal. The process chamber program 124 includes program code to set the timing, gas composition, gas flow rates, chamber pressure, chamber temperature, RF power levels, support position, heater temperature, and other parameters of a particular process. The process sets are predetermined groups of process parameters necessary to carry out specified processes. The process parameters are process conditions, including without limitations, gas composition, gas flow rates, temperature, pressure, gas energizer settings such as RF or microwave power levels, cooling gas pressure, and wall temperature. In addition, parameters needed to operate the process monitoring program 126 are also inputted by a user into the process selector program. These parameters include known properties of the materials being processed, especially radiation absorption and reflection properties, such as reflectance and extinction coefficients; process monitoring algorithms that are modeled from empirically determined data; tables of empirically determined or calculated values that may be used to monitor the process; and properties of materials being processed on the substrate.

The process sequencer program 134 comprises program code to accept a chamber type and set of process parameters from the process selector program 132 and to control its operation. The sequencer program 134 initiates execution of the process set by passing the particular process parameters to a chamber manager program 136 that controls multiple processing tasks in the process chamber 28. Typically, the process chamber program 124 includes a substrate positioning program 138, a gas flow control program 140, a gas pressure control program 142, a gas energizer control program 144, and a heater control program 146. Typically, the substrate positioning program 138 comprises program code for controlling chamber components that are used to load the substrate 20 onto the support 32 and optionally, to lift the substrate 20 to a desired height in the chamber 28 to control the spacing between the substrate 20 and the gas outlets 38 of the gas delivery system 34. The process gas control program 140 has program code for controlling the flow rates of different constituents of the process gas. The process gas control program 140 controls the open/close position of the safety shut-off valves, and also ramps up/down the gas flow controller 40 to obtain the desired gas flow rate. The pressure control program 142 comprises program code for controlling the pressure in the chamber 28 by regulating the aperture size of the throttle valve 44 in the exhaust system 42 of the chamber. The gas energizer control program 144 comprises program code for setting low and high-frequency RF power levels applied to the process electrodes 51, 52 in the chamber 28. Optionally, the heater control program 146 comprises program code for controlling the temperature of a heater element (not shown) used to resistively heat the support 32 and substrate 20.

The process monitoring program 126 comprises program code that obtains sample or reference signals from the radiation source 58, radiation detector 62, or controller 100 and processes the signal according to preprogrammed criteria. Typically, a radiation amplitude or spectrum trace is provided to the controller 100 by an analog to digital converter board in the radiation detector 62. The process monitoring program 126 may also send instructions to the controller 100 to operate components such as the radiation source 58, radiation detector 62, the positioner 72, lens assembly 66, filter 76, and other components. The program may also send instructions to the chamber manager program 136 or other programs to change the process conditions or other chamber settings.

To define the parameters of the process monitoring program 126, initially, one or more substrates 20 having predetermined thicknesses of material are selected for processing. Each substrate 20 is placed at one time into the process chamber 28 and process conditions are set to process a material 22 or an underlying material 24 on the substrate 20. Radiation reflected from the substrate and/or emitted from the plasma in the chamber are monitored using one or more radiation detectors 62. After a series of such traces are developed, they are examined to identify a recognizable change in a property of the trace, which is used as input for the computer program, in the form of an algorithm, a table of values, or other criteria for suitable for evaluating an event in the chamber 28 or a property of the substrate 20. For example, the process monitoring program 126 may include program code to evaluate a signal corresponding to an intensity of reflected radiation which may be used to detect both an onset and completion of processing of the substrate 20. As another example, the computer program 126 comprises program code to evaluate first and second signals that correspond to radiation emitted from the plasma and/or reflected from the substrate 20.

Thus, the process monitoring program 126 may comprise program code to analyze an incoming signal trace provided by the radiation detector 62 and determine a process endpoint or completion of a process stage when a desired set of criteria is reached, such as when an attribute of the detected signal is substantially similar to a pre-programmed value. The process monitoring program 126 may also be used to detect a property of a material being processed on the substrate such as a thickness, or other properties, for example, the crystalline nature, microstructure, porosity, electrical, chemical and compositional characteristics of the material on the substrate 20. The computer program 126 may also be programmed to detect both an onset and completion of processing of the substrate 20, for example, by detecting a change in amplitude or a rate of change of amplitude of radiation 64. The desired criteria are programmed into process monitoring program 126 as preset or stored parameters and algorithms. The program 126 may also include program code for modeling a trace of radiation, selecting a feature from the modeled trace or allowing a user to select the feature, storing the modeled trace or the feature, detecting a portion of an incoming signal from a radiation detector 62, evaluating the measured signal relative to the stored trace or feature, and calling an end of a process stage of the process being performed on the substrate 20 or displaying a measured property of a material on the substrate 20.

In one version, the process monitoring software comprises program code for continuously analyzing a trace of a measured amplitude of reflected radiation by drawing a box or "window" around the end portion of the trace and back in time, with signal height and time length established in the preprogrammed algorithm. A set of windows may be programmed to detect a valley or peak in the trace of the reflected intensity, trigger on an upward slope to detect a later endpoint, or to trigger on a downward slope to detect an endpoint before a valley in the trace. The first criterion is met when the signal in the trace becomes too steep and exits or moves out of the preprogrammed box ("WINDOW OUT") or when it becomes gradual and enters the box ("WINDOW IN"). Additional windows are sequentially applied on the moving trace to generate the complete set of criteria to make a determination on whether the change in signal measured in the real time trace is an endpoint of the process, such as an onset or completion of the process, a change in the property of the material, or is only noise. The direction of entering or exiting a box may also be specified as part of the preprogrammed input criteria for operating the process monitoring program 126. Upon detecting an onset or completion of a process, the process monitoring program signals the process chamber program 126 which sends instructions to the controller 100 to change a process condition in a chamber 28 in which the substrate 20 is being processed. The controller 100 is adapted to control one or more of the gas delivery system 34, plasma generator 46, or throttle valve 44 to change a process condition in the chamber 28 in relation to the received signal.

The data signals received by and/or evaluated by the controller 100 may be sent to a factory automation host computer 300. The factory automation host computer 300 may comprise a host software program 302 that evaluates data from several systems 27, platforms or chambers 28, and for batches of substrates 20 or over an extended period of time, to identify statistical process control parameters of (i) the processes conducted on the substrates 20, (ii) a property that may vary in a statistical relationship across a single substrate 20, or (iii) a property that may vary in a statistical relationship across a batch of substrates 20. The host software program 302 may also use the data for ongoing in-situ process evaluations or for the control of other process parameters. A suitable host software program comprises a WORKSTREAM™ software program available from aforementioned Applied Materials. The factory automation host computer 300 may be further adapted to provide instruction signals to (i) remove particular substrates 20 from the processing sequence, for example, if a substrate property is inadequate or does not fall within a statistically determined range of values, or if a process parameter deviates from an acceptable range; (ii) end processing in a particular chamber 28, or (iii) adjust process conditions upon a determination of an unsuitable property of the substrate 20 or process parameter. The factory automation host computer 300 may also provide the instruction signal at the beginning or end of processing of the substrate 20 in response to evaluation of the data by the host software program 302.

The present invention is described with reference to certain preferred versions thereof, however, other versions are possible. For example, the endpoint detection process can be used for detecting endpoints in other processes and in other chambers as would be apparent to one of ordinary skill, including without limitation, other types of etching chambers, such as capacitively coupled chambers, ion implantation chambers, and deposition chambers such as PVD or CVD chambers. Therefore, the spirit and scope of the appended claims should not be limited to the description of the preferred versions contained herein.

What is claimed is:

1. A substrate processing apparatus comprising:
   a process chamber capable of processing a substrate, the substrate having overlying and underlying materials;
   a radiation source outside the process chamber, the radiation source capable of providing non-polarized radiation that is at least partially reflected from the substrate in the chamber;
   an interferometric radiation detector to detect the reflected radiation and generate an interferometric signal; and
   a controller to
      (i) receive the interferometric signal,
      (ii) calculate a dynamic variance within a predefined time period of the interferometric signal by subtracting an intensity value at a minimum point from an intensity value at a maximum point, and
      (iii) determine a property of the overlying or underlying material on the substrate in the chamber based on the calculated dynamic variance of the interferometric signal.

2. An apparatus according to claim 1 wherein the controller determines both an onset and completion of processing of a plurality of materials on the substrate based on the calculated dynamic variance of the interferometric signal.

3. A method of processing a substrate in a process zone, the method comprising the steps of:
   (a) placing the substrate in the process zone, the substrate having overlying and underlying materials;
   (b) directing non-polarized radiation onto the substrate from a radiation source outside the process zone;
   (c) detecting the non-polarized radiation reflected from the substrate before, during, or after processing of the substrate and generating an interferometric signal;
   (d) calculating a dynamic variance within a predefined time period of the interferometric signal by subtracting an intensity value at a minimum point from an intensity value at a maximum point; and
   (e) determining a property of the overlying or underlying material on the substrate in the process zone from the dynamic variance of the interferometric signal.

4. A method according to claim 3 comprising determining the thickness of the underlying material on the substrate from the dynamic variance of the reflected radiation.

5. A substrate processing apparatus comprising:
   (a) a chamber capable of processing a substrate, the substrate having overlying and underlying materials;
   (b) a radiation source outside the chamber, the radiation source capable of providing nonpolarized radiation that is at least partially reflected from the substrate in the chamber;
   (c) an interferometric radiation detector to detect the reflected radiation and generate an interferometric signal; and
   (d) a computer having a memory capable of operating a computer-readable program embodied on a computer-readable medium, the computer readable program including program code to
      (i) receive the interferometric signal,
      (ii) calculate a dynamic variance within a predefined time period of the interferometric signal by subtracting an intensity value at a minimum point from an intensity value at a maximum point, and
      (iii) determine a property of the overlying or underlying material on the substrate in the chamber from the dynamic variance of the interferometric signal.

6. An apparatus according to claim 5 wherein the program code is adapted to determine (i) a thickness of the underlying material or (ii) a dopant level of the overlying material from the dynamic variance of the reflected radiation.

7. A substrate processing apparatus comprising:
   a process chamber capable of processing a substrate in a plasma;
   a radiation source outside the chamber;
   a plasma emission radiation detector to detect a radiation emission originating from the plasma and generate a plasma emission signal over time, and an interferometric radiation detector to detect a radiation originating from the radiation source and reflected from the substrate and generate an interferometric signal over time; and
   a controller to receive and evaluate the plasma emission and interferometric signals to determine a process endpoint.

8. An apparatus according to claim 7 wherein the controller evaluates the plasma emission and interferometric signals to determine an event in the chamber or a property of a material on the substrate.

9. An apparatus according to claim 7 wherein the controller evaluates the plasma emission and interferometric signals to determine an onset of processing of a material on the substrate.

10. An apparatus according to claim 9 wherein the controller is evaluates the plasma emission and interferometric signals to determine an onset of processing of an underlayer while an overlayer is being processed.

11. An apparatus according to claim 7 wherein the controller combines the plasma emission and interferometric signals.

12. An apparatus according to claim 7 wherein the controller evaluates a derivative of the plasma emission and interferometric signals.

13. An apparatus according to claim 7 wherein the controller detects both an onset and completion of processing of a material on the substrate.

14. A method of processing a substrate in a process zone, the method comprising the steps of:
   (a) placing the substrate in the process zone;
   (b) setting process conditions in the process zone to form a plasma to process the substrate;
   (c) detecting a radiation emission originating from the plasma and generating a plasma emission signal over time;
   (d) detecting a radiation reflected from the substrate and generating an interferometric signal over time; and
   (e) evaluating the plasma emission and interferometric signals to determine the occurrence of an event in the process zone or a property of a material on the substrate.

15. A method according to claim 14 comprising evaluating the plasma emission and interferometric signals to determine an onset of processing of a material on the substrate.

16. A method according to claim 14 comprising evaluating the plasma emission and interferometric signals to determine an onset of processing of an underlayer while an overlayer is being processed.

17. A method according to claim 14 comprising combining the plasma emission and interferometric signals.

18. A method according to claim 14 comprising determining a derivative of the plasma emission and interferometric signals.

19. A substrate processing apparatus comprising:
   (a) a chamber capable of processing a substrate in a plasma;
   (b) a radiation source outside the chamber;
   (c) a plasma emission radiation detector to detect a radiation emission originating from the plasma and generate a plasma emission signal over time, and an interferometric radiation detector to detect radiation originating from the radiation source and reflected from the substrate and generate an interferometric signal over time; and
   (d) a computer having a memory capable of operating a computer-readable program embodied on a computer-readable medium, the computer readable program including program code to receive the plasma emission and interferometric signals and determine an event in the chamber or a property of a material on the substrate.

20. An apparatus according to claim 19 wherein the program code determines a property of the material from a change in amplitude of the radiation.

21. A substrate processing apparatus comprising:
   a chamber capable of processing a substrate, the substrate having overlying and underlying materials;
   a radiation source outside the chamber capable of providing radiation that is at least partially reflected from a substrate in the chamber;
   an interferometric radiation detector to detect the reflected radiation and generated an interferometric signal; and
   a controller to
      (i) receive the interferometric signal,
      (ii) calculate a dynamic variance within a predefined time period of the interferometric signal by subtracting an intensity value at a minimum point from an intensity value at a maximum point, and
      (iii) evaluate the dynamic variance of the interferometric signal in relation to a calculated or stored range of dynamic variances of the signal for a plurality of substrates to determine a property of the overlying or underlying material of the substrate.

22. An apparatus according to claim 21 wherein the controller evaluates the dynamic variance to determine if the dynamic variance is within the calculated or stored range.

23. An apparatus according to claim 21 wherein the controller provides an instruction signal to remove the substrate from the chamber, end processing, or adjust process conditions, in response to the evaluation of the dynamic variance.

24. An apparatus according to claim 21 wherein the controller provides an instruction signal at the beginning of processing of the substrate.

25. An apparatus according to claim 21 wherein the controller evaluates a change in the dynamic variance of the amplitude.

26. A method of processing a substrate in a process zone, the method comprising the steps of:
(a) placing the substrate in the process zone, the substrate having overlying and underlying materials;
(b) detecting radiation that originates from a radiation source outside the process zone and is reflected from the substrate before, during, or after processing of the substrate and generating an interferometric signal;
(c) calculating a dynamic variance within a predefined time period of the interferometric signal by subtracting an intensity value at a minimum point from an intensity value at a maximum point; and
(d) evaluating the dynamic variance of the interferometric signal relative to a calculated or stored range of dynamic variances of amplitude of the interferometric signal for a plurality of substrates to determine a property of the overlying or underlying material of the substrate.

27. A method according to claim 26 wherein the step (d) comprises determining if the dynamic variance is within the calculated or stored range.

28. A method according to claim 26 further comprising the step of providing an instruction signal to remove the substrate from the chamber, end processing, or adjust process conditions, in relation to the evaluation step.

29. A method according to claim 28 comprising providing the instruction signal to adjust process conditions at the beginning of processing of the substrate.

30. A method according to claim 26 comprising evaluating a change in the dynamic variance of the amplitude.

31. A substrate processing apparatus comprising:
(a) a chamber capable of processing a substrate, the substrate having overlying and underlying materials;
(b) a radiation source outside the chamber, the radiation source capable of providing radiation that is a least partially reflected from the substrate during processing;
(c) an intererometric radiation detector to detect the reflected radiation and generate an interferometric signal; and
(d) a computer having a memory capable of operating a computer-readable program embodied on a computer-readable medium, the computer readable program including program code to
(i) receive the interferometric signal,
(ii) calculate a dynamic variance within a predefined time period of the interferometric signal by subtracting an intensity value at a minimum point from an intensity value at a maximum point, and
(iii) evaluate the dynamic variance of the interferometric signal in relation to a range of dynamic variances of the signal for a plurality of substrates to determine a property of the overlying or underlying material of the substrate.

32. An apparatus according to claim 31 wherein the program code evaluates the dynamic variance to determine if the dynamic variance is within the range.

33. An apparatus according to claim 31 wherein the program code provides an instruction signal to remove the substrate from the chamber, end processing, or adjust process conditions, in response to the evaluation of the dynamic variance.

34. A substrate processing apparatus comprising:
a chamber capable of processing a substrate, the substrate having overlying and underlying materials;
a radiation source outside the chamber, the radiation source capable of providing radiation that is at least partially reflected from the substrate in the chamber;
an interferometric radiation detector to detect the reflected radiation and generate an interferometric signal;
a controller to
(i) receive the interferometric signal,
(ii) calculate a dynamic variance within a predefined time period of the interferometric signal by subtracting an intensity value at a minimum point from an intensity value at a maximum point, and
(iii) generate a set of data from the dynamic variance relating to a property of the overlying or underlying material of the substrate; and
a factory automation host computer to receive and evaluate the data, and control the processing of the substrate in relation to the data.

35. An apparatus according to claim 34 wherein the factory automation host computer comprises a software program for substrate evaluation, process evaluation or process control.

36. An apparatus according to claim 35 wherein the software program evaluates the data to determine statistical process control parameters.

37. An apparatus according to claim 34 wherein the factory automation host computer provides an instruction signal to remove the substrate from the chamber, end processing, or adjust process conditions, upon a determination of an unsuitable property of the substrate or an unsuitable process parameter.

38. An apparatus according to claim 37 wherein the factory automation host computer provides the instruction signal to adjust process conditions at the beginning or end of processing of the substrate.

39. A substrate processing apparatus comprising:
a process chamber capable of processing a substrate, the substrate having overlying and underlying materials;
a radiation source capable of providing non-polarized radiation that is at least partially reflected from the substrate in the chamber;
a radiation detector to detect the reflected radiation and generate a signal trace; and
a controller to receive the signal trace and determine a property of the overlying or underlying material of the substrate in the chamber by determining whether the values of a sequence of slopes over time of the signal trace are substantially similar to the values of a sequence of preprogrammed slopes.

40. A method of processing a substrate in a process zone, the method comprising the steps of:
(a) placing the substrate in the process zone, the substrate having overlying and underlying materials;
(b) detecting radiation reflected from the substrate before, during, or after processing of the substrate; and
(c) evaluating the detected radiation to determine a property of the overlying or underlying material of the substrate in the process zone by determining whether a sequence of values of the slope over time of an amplitude of the detected radiation are substantially similar to the values of a sequence of preprogrammed slopes.

* * * * *